United States Patent [19]

Keramidas et al.

[11] Patent Number: 4,500,367

[45] Date of Patent: Feb. 19, 1985

[54] LPE GROWTH ON GROUP III-V COMPOUND SEMICONDUCTOR SUBSTRATES CONTAINING PHOSPHORUS

[75] Inventors: Vassilis G. Keramidas, Warren; Jose A. Lourenco, Union, both of N.J.

[73] Assignee: AT&T Bell Laboratories, Murray Hill, N.J.

[21] Appl. No.: 547,333

[22] Filed: Oct. 31, 1983

[51] Int. Cl.$^3$ .......................................... H01L 21/208
[52] U.S. Cl. .................................... 148/171; 148/172; 148/173
[58] Field of Search ................. 148/171, 172, 173, 1.5

[56] References Cited

U.S. PATENT DOCUMENTS

| | | | |
|---|---|---|---|
| 3,665,888 | 5/1972 | Bergh et al. | 148/171 X |
| 3,960,618 | 6/1976 | Kawamura et al. | 148/171 |
| 3,975,218 | 8/1976 | Ruehrwein | 148/175 |
| 3,996,891 | 12/1976 | Isawa et al. | 118/423 |
| 4,072,544 | 2/1978 | DeWinter et al. | 148/171 |
| 4,154,630 | 5/1979 | Diguet et al. | 148/171 |
| 4,357,897 | 11/1982 | Leswin | 148/171 X |
| 4,372,791 | 2/1983 | Hsieh | 148/171 |

OTHER PUBLICATIONS

"Suppression of Thermal Damage of InP by Adding Ar in $H_2$ Atmosphere," K. Pak et al., *Japanese Journal of Applied Physics,* vol. 18, No. 9, 1979, pp. 1859-1860.

*Primary Examiner*—G. Ozaki
*Attorney, Agent, or Firm*—David I. Caplan

[57] ABSTRACT

Liquid phase epitaxy (LPE) growth of a Group III-V semiconductor compound layer upon a Group III-V semiconductor compound substrate containing phosphorus is accomplished in a graphite meltholder by heating the substrate in an atmosphere of nitrogen or helium and contacting the substrate with a liquid melt, capable of growing the layer, in an atmosphere of hydrogen.

14 Claims, No Drawings

LPE GROWTH ON GROUP III-V COMPOUND SEMICONDUCTOR SUBSTRATES CONTAINING PHOSPHORUS

FIELD OF THE INVENTION

This invention relates to liquid phase epitaxial growth on Group III-V compound semiconductor substrates and to the products of such growth.

BACKGROUND OF THE INVENTION

Epitaxial layers of Group III-V compound semiconductors—such an InP (indium phosphide), InGaAs (indium gallium arsenide), and InGaAsP—are commonly grown on single crystal substrates, such as InP, by a process known as liquid phase epitaxy (LPE). This process entails bringing molten solution(s) of the corresponding chemical constituents of the desired epitaxial layer(s) into contact with the heated substrate in a furnace. A controlled cooling program causes material to precipitate from the solution onto the substrate and thus to grow the corresponding epitaxial layer. During growth the furnace atmosphere is typically one of hydrogen, helium, nitrogen, argon, or combinations thereof. Typically, the substrate is located in a recess of a sliding member ("slider") which is pushed into contact with different molten solutions ("melts") contained in successive wells in a meltholder, in order to grow a succession of epitaxial layers of differing chemical composition ("heterostructure"). The slider and meltholder are typically made of graphite, and both slider (with substrate) and meltholder (with melt) are initially heated in the furnace to a common temperature for homogenizing the melt(s) prior to pushing the substrate into contact with any melt.

Of particular interest is the LPE growth of Group III-V compound semiconductors such as InP, InGaAs, and InGaAsP because heterostructures of these materials are important for use as light emitting diodes, lasers, photodetectors, field effect transistors, and other devices. The performance of these devices depends to a large degree upon the quality of the substrate and the epitaxial layers. A major problem associated with LPE growth on InP substrates, for example, is the decomposition of the InP caused by the disproportionate loss of phosphorus by dissociation from the InP substrate above 365 degrees C., which occurs when the surface of the substrate is exposed and heated before contact with any melt. This phosphorus loss creates In-rich pits that propagate through the layer as undesirable inclusions which degrade the performance of the devices. Therefore, minimizing InP substrate decomposition is very important.

In prior art, during heating necessary for homogenizing the melt(s) prior to LPE growth, the InP substrate is subjected to a localized partial pressure of phosphorus, as provided by a variety of techniques, to retard InP substrate decomposition. These techniques include the use of an InP cover piece as a source of phosphorus, to create a local phosphorus overpressure and thus suppress loss of phosphorus from the substrate, in a hydrogen ($H_2$) growth atmosphere. An alternative approach, reported by K. Pak et al, *Japan Journal of Applied Physics*, Vol. 18, No. 9, page 1859 (1979), is to introduce Ar into the growth ambient, in order to produce Ar-$H_2$ gas mixtures in the furnace atmosphere. However, neither of these approaches suppresses the decomposition of the InP substrate as much as desired.

SUMMARY OF THE INVENTION

We have found in connection with LPE growth processes that the thermal decomposition of P-containing Group III-V compound semiconductor substrates, such as InP or InGaAsP, is desirably reduced by the use of nitrogen or helium as the atmosphere in conjunction with an InP cover piece prior to contact of substrate with melt, i.e., when both substrate and melt are being heated in the same furnace to a common temperature. In particular, a nitrogen or helium atmosphere has been found to be superior to a hydrogen atmosphere in suppressing thermal damage of InP substrates. We have also found that this use of nitrogen or helium, however, subsequently introduces another problem which is especially serious when using fine grain graphite instead of coarse grain graphite as the material for slider and meltholder. The fine grain graphite (grain size less than about 10 micron) has the advantage of smooth surfaces which facilitate sliding of the slider relative to the meltholder and do not trap impurities; however, when using a nitrogen or helium growth atmosphere, the fine grain graphite exacerbates the subsequent problem of the adhesion of solidified melt to the slider upon cooling to room temperature after the LPE growth is completed. While gentle tapping of the meltholder was found to be sufficient to loosen and detach the slider from the meltholder after cooling in the case of coarse grain graphite, severe banging (sometimes to the point of breaking) was required in the case of fine grain graphite. As a result, pieces of graphite undesirably break off and are introduced into the melt, thereby precluding reuse of the melt of subsequent LPE growth on another substrate. Sometimes, reheating and remelting is necessary in order to remove the melts. Thus, there are two problems: (1) decomposition of InP substrate during heating of substrate and melts together in a furnace before LPE growth, and (2) adhesion of solidified melts upon cooling after LPE growth. We have found that the use of a helium or nitrogen atmosphere (together with an InP cover) in which to heat the substrate and melts to a common temperature immediately before LPE growth followed by the use of a hydrogen atmosphere during LPE growth alleviates both the problem of phosphorus dissociation from the substrate and the problem of the adhesion of solidified melts to graphite (fine grain or coarse grain). It is theorized that when the substrate is in contact with a melt during LPE growth, there is no further need to suppress dissociation, and thus hydrogen can then be used, and the hydrogen, being a reducing atmosphere, helps reduce undesirable oxide impurities which otherwise may form during the LPE growth. It should be understood, however, that the utility of this invention does not depend upon the correctness of this theory.

In a specific embodiment of the invention, LPE growth upon an InP substrate of an epitaxial layer of material is accomplished by a process comprising the steps of: (a) heating the substrate in a recess in a graphite sliding member and the material in a graphite well to a predetermined temperature in a nonreducing gas atmosphere, such as essentially helium or nitrogen; (b) pushing the sliding member so that the substrate comes into contact with a melt; (c) changing the atmosphere to a reducing gas, such as essentially hydrogen, substantially immediately before (or after) pushing the substrate into contact with the melt.

DETAILED DESCRIPTION

This invention, together with its various features and advantages, can be better understood from the following more detailed description in which the materials, concentrations, temperatures, and other parameters are given only by way of illustration and, unless otherwise stated, are not intended to limit the scope of the invention.

The following example describes the growth of a double heterostructure of InP/InGaAsP suitable for a light emitting diode of wavelength about 1.3 micron. All gases are at a pressure of essentially one atmosphere.

EXAMPLE

A single crystal substrate of InP is prepared with a major surface oriented normal to the (100) crystallographic direction. This crystal substrate is n-type semiconductor, as a result of being doped with sulfur impurity in a concentration of about $5 \times 10^{18}$ atoms per $cm^3$. The substrate is located in a recess of a fine grain graphite sliding member, and the sliding member is located in a suitable initial position in a fine grain graphite meltholder. The meltholder contains a multiple-well structure, each well of which contains a (different) suitable melt, as more fully described below. The substrate is covered with an InP cover. The meltholder is placed in a furnace initially maintained at a temperature of about 665 degrees C. and is kept at this temperature for about an hour, in order to homogenize the melts in the wells. The furnace contains an atmosphere of pure nitrogen gas, as by flowing the gas at a rate of about 500 $cm^3$/minute. After the hour during which this homogenization is accomplished, the temperature is continuously lowered at a constant rate of about 0.7 degrees C./minute. Advantageously, the hydrogen is purified just before introduction into the furnace by passage through a palladium filter. When the temperature goes down to about 647 degrees C., the gas flow is switched from nitrogen to hydrogen at the same rate of gas flow. When the temperature goes down to about 646 degrees C., the sliding member is pushed to bring the InP substrate successively in contact with the various wells, one at a time.

More specifically, a first well contains pure In, a second well contains In, Sn, and excess InP, a third well contains In, Ga, As, and excess InP, a fourth well contains In, Zn, and excess InP, and a fifth well contains In, As, Ga, Zn, and excess InP. The purpose of the melt in the first well is to dissolve the resulting phosphorus-poor indium phosphide, typically a few microns thick, at the exposed top surface of the InP substrate; the purpose of the melt in the second well is to form an n-type InP "buffer" layer having a thickness in the range of about 3 to 5 micron; the purpose of the melt in the third well is to form an undoped InGaAsP "active" layer for emitting the 1.3 micron light; the purpose of the melt in the fourth well is to form a p-type InP light-confining layer having a thickness of about 1.0 micron; and the purpose of the melt in the fifth well is to form a p-type InGaAsP contact layer ("cap") having a thickness of about 0.5 micron. The thickness of each such layer is controlled by the time of contact allowed between the exposed top surface of the substrate and the corresponding melt.

The exposed top surface of the substrate is pushed into contact with the melt in the first well for about 10 seconds, and then the melt in the second well for enough time until the temperature goes down to about 639 degrees C. The temperature is then held at this temperature of about 639 degrees C. while the substrate is pushed into contact with the melt in the third well for about 4 minutes. Then the temperature is continuously lowered at a rate of about 0.7 degrees C. per minute, and the substrate is immediately pushed into contact with the melt in the fourth well and remains there until the temperature goes down to about 636 degrees C. At this time, the temperature of the furnace is maintained at this temperature of about 636 degrees C., and the substrate is pushed into contact with the melt in the fifth well and kept there for about 1 minute. Finally, the substrate is pushed out of contact with the melts, wiped off, and the meltholder and slider assembly pulled out of the furnace.

Although the invention has been described in terms of a specific example, various modifications can be made without departing from the scope of the invention. Instead of nitrogen, helium can be used. Instead of hydrogen, other reducing gases might be found to be useful. Moreover, instead of switching to hydrogen substantially immediately (within about 5 minutes or less) before pushing the substrate into contact with the melt in the first well, the switching to hydrogen can be done substantially immediately thereafter. It should also be understood that a variety of other structures with other light emitting or other properties can be made by varying the number of wells or the compositions of the melts or both. Finally, the invention is also applicable to LPE growth of any Group III-V compound semiconductor upon a substrate of InP or indeed upon any Group III-V compound semiconductor substrate which contains phosphorus.

What is claimed is:

1. A method for liquid phase epitaxially growing, upon a first Group III-V semiconductor compound substrate containing phosphorus, a layer of a second Group III-V semiconductor compound comprising the steps of:
   (a) heating in a first gas atmosphere comprising nitrogen or helium to a first predetermined temperature both the substrate and a molten solution from which the second compound can be grown;
   (b) contacting the substrate with the molten solution in a second gas atmosphere comprising hydrogen; and
   (c) cooling the substrate and the molten solution in the second atmosphere at a predetermined rate, whereby the layer of the second compound epitaxially grows upon the substrate.

2. The method of claim 1 in which the molten solution is located in a well and the substrate in a sliding member, whereby the second atmosphere prevents adhesion of the well to the sliding member.

3. The method of claim 2 in which the surface of the well comprises graphite.

4. The method of claim 1 in which the first atmosphere is essentially nitrogen and the substrate is covered with an InP cover during step (a).

5. The method of claim 1 in which the first atmosphere is essentially helium and in which the substrate is covered with an InP cover during step (a).

6. A method of liquid phase epitaxial growth of an epitaxial layer of material upon an InP crystal substrate comprising the steps of:
   (a) heating both the substrate and the material, in an atmosphere of essentially nitrogen, in a furnace at a predetermined temperature for a predetermined amount of time, the substrate being covered with an InP cover and being situated in a recess of a graphite sliding member, the material being contained in a graphite well;
   (b) changing the atmosphere essentially to hydrogen; and
   (c) bringing the substrate, situated in the sliding member, into contact with a melt of composition suitable for the epitaxial growth of the layer; and
   (d) cooling the furnace at a predetermined rate, whereby the epitaxial growth of the layer results.

7. A method of liquid phase epitaxial growth of an epitaxial layer upon an InP crystal substrate comprising the steps of:
   (a) heating the substrate, while covered with an InP cover, in an atmosphere of essentially nitrogen, at a predetermined temperature for a predetermined amount of time, the substrate being situated in a recess of a graphite sliding member;
   (b) changing the atmosphere essentially to hydrogen;
   (c) pushing the substrate, while situated in the sliding member, into contact with a melt having a composition suitable for the epitaxial growth of the layer; and
   (d) cooling the substrate and the melt at a predetermined rate whereby the epitaxial growth occurs.

8. A method of liquid phase epitaxial growth of an epitaxial layer of material upon a substrate containing phosphorus comprising the steps of:
   (a) heating the substrate in a recess in a graphite sliding member and the material in a graphite well to a predetermined temperature in an atmosphere consisting essentially of nitrogen;
   (b) pushing the sliding member so that the substrate comes into contact with a melt having a composition suitable for the epitaxial growth of the layer;
   (c) changing the atmosphere to hydrogen substantially immediately before pushing the substrate into contact with the melt; and
   (d) cooling the substrate and the melt at a predetermined rate whereby the epitaxial growth occurs.

9. A method of liquid phase epitaxial growth of an epitaxial layer of material upon a substrate containing phosphorus comprising the steps of:
   (a) heating the substrate in a recess in a graphite sliding member and the material in a graphite well to a predetermined temperature in an atmosphere consisting essentially of nitrogen;
   (b) pushing the sliding member so that the substrate comes into contact with a melt; and
   (c) changing the atmosphere to hydrogen substantially immediately after pushing the substrate into contact with the melt.

10. A method of liquid phase epitaxial growth of an epitaxial layer upon an InP crystal substrate comprising the steps of:
    (a) heating the substrate, while covered with an InP cover, in an atmosphere of essentially helium, at a predetermined temperature for a predetermined amount of time, the substrate being situated in a recess of a graphite sliding member;
    (b) changing the atmosphere essentially to hydrogen; and
    (c) pushing the substrate, while situated in the sliding member, into contact with a melt having a composition suitable for the epitaxial growth of the layer; and
    (d) cooling the substrate and the melt at a predetermined rate whereby the epitaxial growth occurs.

11. A method of liquid phase epitaxial growth of an epitaxial layer of material upon a substrate containing phosphorus comprising the steps of:
    (a) heating the substrate in a recess in a graphite sliding member and the material in a graphite well to a predetermined temperature in an atmosphere consisting essentially of helium;
    (b) pushing the sliding member so that the substrate comes into contact with a melt having a composition suitable for the epitaxial growth of the layer;
    (c) changing the atmosphere to hydrogen substantially immediately before pushing the substrate into contact with the melt; and
    (d) cooling the substrate at a predetermined rate whereby the epitaxial growth of the layer results.

12. A method of liquid phase epitaxial growth of an epitaxial layer of material upon a substrate containing phosphorus comprising the steps of:
    (a) heating the substrate in a recess in a graphite sliding member and the material in a graphite well to a predetermined temperature in an atmosphere consisting essentially of helium;
    (b) pushing the sliding member so that the substrate comes into contact with a melt having a composition suitable for the epitaxial growth of the layer;
    (c) changing the atmosphere to hydrogen substantially immediately after pushing the substrate into contact with the melt; and
    (d) cooling the substrate and the melt at a predetermined rate whereby the epitaxial growth of the layer occurs.

13. A method of liquid phase epitaxial growth of an epitaxial layer of material upon an InP crystal substrate comprising the steps of:
    (a) heating both the substrate and the material, in an atmosphere of essentially nitrogen, in a furnace at a predetermined temperature for a predetermined amount of time, the substrate being covered with an InP cover and being situated in a recess of a graphite sliding member, the material being contained in a graphite well;
    (b) bringing the substrate, situated in the sliding member, into contact with a melt of composition suitable for the epitaxial growth of the layer;
    (c) changing the atmosphere essentially to hydrogen; and
    (d) cooling the furnace at a predetermined rate, whereby the epitaxial growth of the layer results.

14. A method of liquid phase epitaxial growth of an epitaxial layer upon an InP crystal substrate comprising the steps of:
    (a) heating the substrate, while covered with an InP cover, in an atmosphere of essentially helium, at a predetermined temperature for a predetermined amount of time, the substrate being situated in a recess of a graphite sliding member;
    (b) pushing the substrate, while situated in the sliding member, into contact with a melt having a composition suitable for the epitaxial growth of the layer;
    (c) changing the atmosphere essentially to hydrogen; and
    (d) cooling the substrate and the melt at a predetermined rate whereby the epitaxial growth occurs.

* * * * *